(12) United States Patent
Sumita et al.

(10) Patent No.: US 6,294,271 B1
(45) Date of Patent: Sep. 25, 2001

(54) FLIP-CHIP TYPE SEMICONDUCTOR DEVICE SEALING MATERIAL AND FLIP-CHIP TYPE SEMICONDUCTOR DEVICE

(75) Inventors: Kazuaki Sumita; Kimitaka Kumagae; Miyuki Wakao; Toshio Shiobara, all of Gunma-ken (JP)

(73) Assignee: Shin-Etsu Chemical Co., Ltd., Toyko (JP)

( * ) Notice: Subject to any disclaimer, the term of this patent is extended or adjusted under 35 U.S.C. 154(b) by 0 days.

(21) Appl. No.: 09/499,382

(22) Filed: Feb. 7, 2000

(30) Foreign Application Priority Data

Feb. 12, 1999 (JP) .................................................. 11-033730

(51) Int. Cl.$^7$ .................................................. H01L 29/12
(52) U.S. Cl. .......................... 428/620; 257/793; 523/429; 523/440; 523/443; 523/466
(58) Field of Search .......................... 428/620; 257/793; 523/429, 440, 443, 466

(56) References Cited

U.S. PATENT DOCUMENTS

| 4,999,699 | | 3/1991 | Christie . | |
|---|---|---|---|---|
| 5,089,440 | | 2/1992 | Christie . | |
| 5,248,710 | * | 9/1993 | Shiobara et al. ..................... | 523/435 |
| 5,292,688 | | 3/1994 | Hsiao . | |
| 5,928,595 | | 7/1999 | Knapp . | |

* cited by examiner

*Primary Examiner*—Robert Dawson
*Assistant Examiner*—D. Aylward
(74) *Attorney, Agent, or Firm*—Birch, Stewart, Kolasch & Birch, LLP

(57) ABSTRACT

In a liquid epoxy resin composition comprising a liquid epoxy resin and an inorganic filler, a specific imidazole compound having a solubility of up to 1% by weight in the epoxy resin, a melting point of at least 170° C., a mean particle diameter of 1–5 $\mu$m, and a maximum particle diameter of up to 20 $\mu$m is used as a curing accelerator. The resulting composition is suited as a sealing material for flip-chip type semiconductor devices since it has improved thin-film infiltration and storage stability.

3 Claims, 1 Drawing Sheet

FLIP-CHIP TYPE SEMICONDUCTOR DEVICE SEALING MATERIAL AND FLIP-CHIP TYPE SEMICONDUCTOR DEVICE

This invention relates to a flip-chip type semiconductor device sealing material and a flip-chip type semiconductor device encapsulated therewith.

BACKGROUND OF THE INVENTION

With the advance of electric equipment toward smaller size, lighter weight and higher performance, the semiconductor mounting technology has changed from the pin mating type to the surface mounting which now becomes the mainstream. One bare chip mounting technology is flip-chip (FC) mounting. The flip-chip mounting is a technique of providing an LSI chip on its circuit pattern-bearing surface with several to several thousands of electrodes, known as bumps, of about 10 to 100 microns high and joining the chip to electrodes on a substrate with a conductive paste or solder. Then the sealing material used for the protection of FC devices must penetrate into gaps of several tens of microns defined by bumps between the substrate and the LSI chip. Conventional liquid epoxy resin compositions used as the underfill material for flip-chip devices are generally composed of a liquid epoxy resin, a curing agent and an inorganic filler. Of these, the most predominant is a composition in which a large amount of inorganic filler is blended in order to provide a matching coefficient of linear expansion with those of semiconductor chips, substrates and bumps for increased reliability.

With respect to stress properties, the flip-chip underfill materials with high loading of filler give rise to no problem. However, they suffer from very low productivity since they have a high viscosity due to the high filler loading so that they may penetrate into the gap between chip and substrate at a very slow rate. There is a desire to overcome this problem.

In conventional liquid epoxy resin compositions used as underfill material, acid anhydrides are often employed as the curing agent. Since the acid anhydrides are hygroscopic, there arises prior to curing a phenomenon that a viscosity increase due to moisture absorption can cause varying infiltration or interrupt infiltration. Also, the acid anhydrides are likely to pick up moisture prior to curing and even after curing, subject to enhanced hydrolysis by virtue of ester bonds, both of which in turn can cause volumetric expansion, increasing the resistance at the interface between solder bumps and leads. This gives rise to a reliability problem.

SUMMARY OF THE INVENTION

An object of the invention is to provide a flip-chip type semiconductor device sealing material which maintains a low enough viscosity to ensure interstitial infiltration even when filled with a large amount of inorganic filler. Another object is to provide a flip-chip type semiconductor device encapsulated with the sealing material and having improved reliability.

It has been found that a liquid epoxy resin composition comprising a liquid epoxy resin and an inorganic filler is improved using as a reaction or curing accelerator a specific imidazole compound of the general formula (1) to be defined below having a solubility of up to 1% by weight in the epoxy resin, a melting point of at least 170° C., a mean particle diameter of 1 to 5 µm, and a maximum particle diameter of up to 20 µm. The resulting composition remains highly stable at elevated temperatures and when used for the encapsulation of flip-chip semiconductor devices, can infiltrate through narrow gaps at a low viscosity even with high loading of the inorganic filler, as long as the semiconductor device is heated to elevated temperatures. The composition thus provides a sealing material suitable as an underfill material for flip-chip semiconductor devices.

As described above, acid anhydrides are widely employed as the curing agent in conventional liquid epoxy resin compositions used as underfill material. Since the acid anhydrides are hygroscopic, there arises prior to curing a phenomenon that a viscosity increase due to moisture absorption can diversify the infiltration capability or interrupt infiltration. Also, the acid anhydrides are likely to pick up moisture prior to curing and even after curing, subject to enhanced hydrolysis by virtue of ester bonds, both of which in turn can cause volumetric expansion, increasing the resistance at the interface between solder bumps and leads. This gives rise to a reliability problem. It is thus believed that how to reduce the saturation moisture pickup is a key to reliability improvement. A study is made on a resin composition having epoxy self-condensation or ether bonds which are less liable to hydrolysis than ester bonds. Use of this curing system can minimize the deterioration of properties by humidity, for example, lowering of bonding force and glass transition temperature (Tg) after water absorption. However, the epoxy self-condensation system has a drawback that it tends to be highly viscous because of the resin's viscosity and thus has an inferior infiltration capability, as compared with the acid anhydride curing system. This drawback can be overcome by using the curing accelerator which is stable at elevated temperatures and keeping the device at elevated temperatures so that the sealing material may become low viscous and have a high infiltration capability. In addition, as opposed to the acid anhydride system which is unstable during storage and must be kept at very low temperatures for storage, the composition of the invention using a potential catalyst is improved in storage stability and its viscosity remains unchanged over 168 hours at room temperature.

Accordingly, a sealing material for flip-chip type semiconductor devices in the form of a liquid epoxy resin composition as defined herein has improved thin-film infiltration capability and storage stability as an underfill material. A semiconductor device encapsulated with the sealing material remains highly reliable.

Thus the invention provides a sealing material for flip-chip type semiconductor devices in the form of a liquid epoxy resin composition comprising (A) a liquid epoxy resin, (B) an inorganic filler, and (C) a curing accelerator having a solubility of up to 1% by weight in the epoxy resin, a melting point of at least 170° C., a mean particle diameter of 1 to 5 µm, and a maximum particle diameter of up to 20 µm. The curing accelerator is represented by the following general formula (1):

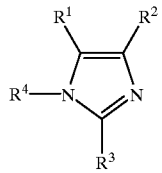

(1)

wherein $R^1$ and $R^2$ each are hydrogen, methyl, ethyl, hydroxymethyl or phenyl, $R^3$ is methyl, ethyl, phenyl or allyl, and $R^4$ is hydrogen or a group of the following formula (2):

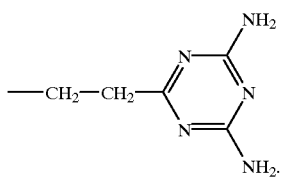
(2)

Also contemplated herein is a flip-chip type semiconductor device sealed with the sealing material.

DESCRIPTION OF THE PREFERRED EMBODIMENTS

Figure 1:
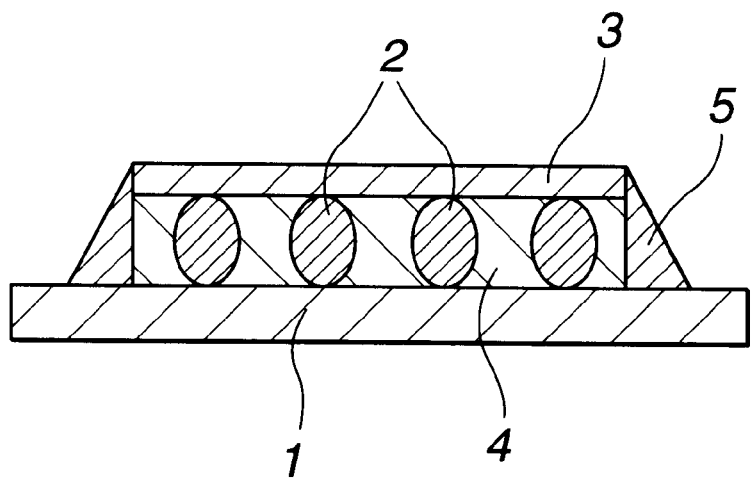
FIG. 1 is a schematic cross-sectional view of a flip-chip type semiconductor device according to one embodiment of the invention.

In the epoxy resin composition providing a flip-chip type semiconductor device sealing material according to the invention, the liquid epoxy resin used as component (A) may be any epoxy resin as long as it has at least two epoxy groups in a molecule. Preferred examples include bisphenol type epoxy resins such as bisphenol A type epoxy resins and bisphenol F type epoxy resins, novolac type epoxy resins such as phenol novolac type epoxy resins and cresol novolac type epoxy resins, naphthalene type epoxy resins, biphenyl type epoxy resins, and cyclopentadiene type epoxy resins. Of these, epoxy resins which are liquid at room temperature are used. Any of epoxy resins of the following structure may be added to the foregoing epoxy resins in such an amount as not to adversely affect the interstitial infiltration thereof.

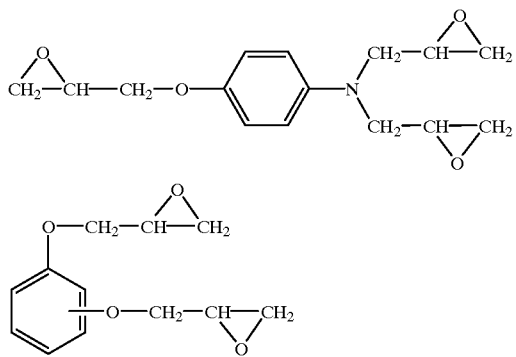

The liquid epoxy resins preferably have a total chlorine content of up to 1,500 ppm, and especially up to 1,000 ppm. When chlorine is extracted from the epoxy resin with water at an epoxy resin concentration of 50% and a temperature of 100° C. over a period of 20 hours, the water-extracted chlorine content is preferably up to 10 ppm. At a total chlorine content of greater than 1,500 ppm or a water-extracted chlorine level of more than 10 ppm, the semiconductor device would become less reliable, especially in the presence of moisture.

To the epoxy resin composition, a variety of well-known inorganic fillers are added as component (B) for the purpose of reducing a coefficient of expansion. Useful inorganic fillers include fused silica, crystalline silica, alumina, boron nitride, aluminum nitride, silicon nitride, magnesia, and magnesium silicate. In order that the sealing material achieve both an improvement in infiltration and a reduction of linear expansion, the inorganic filler preferably has a mean particle diameter of less than about 1/10 and a maximum particle diameter of less than about ½ of the flip-chip gap width (that is the distance of the substrate-to-chip gap). Especially, the inorganic filler may usually have a mean particle diameter of 10 μm or less, preferably 0.5 to 10 μm, more preferably 1 to 5 μm, most preferably 1 to 3 μm, and a maximum particle diameter of up to 50 μm, preferably up to 45 μm. In the present invention, the mean particle diameter can be determined as a weight average value (or median diameter) by means of a particle size distribution meter using laser light diffractometry and similar analysis means.

The inorganic filler is preferably blended in an amount of about 100 to 400 parts, more desirably about 150 to 250 parts by weight per 100 parts by weight of the epoxy resin. On this basis, less than 100 parts of the inorganic filler would provide an epoxy resin composition with a greater coefficient of expansion so that cracks may be incurred in a thermal cycling test. An epoxy resin composition with more than 400 parts of the inorganic filler would be too viscous, restraining its infiltration in thin film form.

According to the invention, an imidazole compound of the following general formula (1) having a solubility of up to 1% by weight in the epoxy resin, a melting point of at least 170° C., a mean particle diameter of 1 to 5 μm, and a maximum particle diameter of up to 20 μm is used as a reaction or curing accelerator for the above-described epoxy resin.

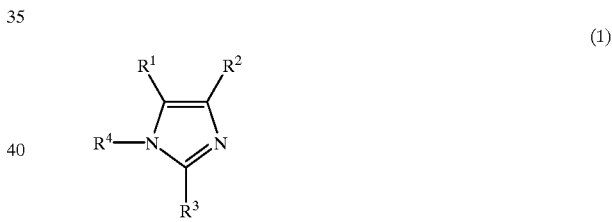
(1)

Herein $R^1$ and $R^2$ each are hydrogen, methyl, ethyl, hydroxymethyl or phenyl, $R^3$ is methyl, ethyl, phenyl or allyl, and $R^4$ is hydrogen or a group of the following formula (2).

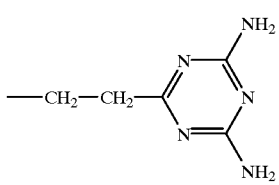
(2)

Illustratively, the most preferred curing accelerators are imidazole derivatives having a melting point of at least 170° C., such as 2,4-diamino-6-[2'-methylimidazolyl-(1)']-ethyl-S-triazine, 2,4-diamino-6-[2'-ethyl-4'-methylimidazolyl-(1)']-ethyl-S-triazine, 2,4-diamino-6-[2'-methylimidazolyl-(1)']-ethyl-S-triazine isocyanuric acid adduct, 2-phenyl-4-methyl-5-hydroxymethyl-imidazole, 2-phenyl-4,5-dihydroxymethylimidazole, 2-allyl-4,5-diphenylimidazole, and 2,4,5-triphenylimidazole. These imidazole derivatives are solid at room temperature. Useful are those imidazole derivatives having a mean particle diameter of up to 5 μm and a maximum particle diameter of up to 20 μm, and especially a mean particle diameter of 2 to 5 μm and a maximum particle diameter of up to 15 μm. A curing accelerator having too small a mean particle diameter has an increased specific surface area so that when mixed with the epoxy resin, the composition may have a higher viscosity. A curing accelerator having a mean particle diameter in excess of 5 μm is non-uniformly dispersed in the epoxy resin, leading to a loss of reliability. Preferably the curing accelerator has a greater particle size and specific surface area than the inorganic filler because the curing accelerator would otherwise be non-uniformly dispersed during mixing, leading to ineffective curing and adversely affecting reliability. When a silica filler has a mean particle diameter of 1 to 3 μm and a specific surface area of 2.5 m²/g, for example, the curing accelerator should preferably have a mean particle diameter of 3 to 5 μm and a specific surface area of 2.5 to 10 m²/g. The curing accelerator preferably has a purity of at least 90%, and more preferably at least 93%. The curing accelerator with a purity of less than 90% may give varying reactivity, resulting in varying curing and infiltration properties.

Understandably, the mean particle diameter as used herein can be determined, for example, as the weight average (median diameter) in the particle size distribution as measured by the laser light diffraction method.

Preferably the curing accelerator is blended in an amount of about 1 to 15 parts, and especially about 2 to 7 parts by weigh per 100 parts by weight of the epoxy resin. Less amounts of the curing accelerator may lead to short curing whereas excessive amounts may detract from storage stability.

In the epoxy resin composition, silicone rubber, silicone oil, liquid polybutadiene rubber or a thermoplastic resin such as methyl methacrylate-butadiene-styrene copolymer may be blended for the purpose of stress reduction. The preferred stress reducing agent is a copolymer obtained through addition reaction between an epoxy or phenolic resin having alkenyl groups and an organopolysiloxane represented by the following average compositional formula (3) and having 20 to 400, preferably 40 to 200 silicon atoms and 1 to 5, preferably 1 to 3, more preferably 2 SiH groups per molecule. The addition reaction takes place between alkenyl groups on the epoxy or phenolic resin and SiH groups on the organopolysiloxane.

$$H_a R_b SiO_{(4-a-b)/2} \tag{3}$$

Herein R is a substituted or unsubstituted monovalent hydrocarbon group, a is a positive number of 0.002 to 0.1, preferably 0.01 to 0.1, b is a positive number of 1.8 to 2.2, preferably 1.95 to 2.05, and the sum of a and b is from 1.81 to 2.3, preferably 1.96 to 2.06 (i.e., $1.81 \leq a+b \leq 2.3$, preferably $1.96 \leq a+b \leq 2.06$).

The monovalent hydrocarbon groups represented by R are preferably those of 1 to 10 carbon atoms, especially 1 to 8 carbon atoms, for example, alkyl groups such as methyl, ethyl, propyl, isopropyl, butyl, isobutyl, tert-butyl, hexyl, cyclohexyl, octyl, and decyl; alkenyl groups such as vinyl, allyl, propenyl, butenyl, and hexeny; aryl groups such as phenyl, xylyl and tolyl; and aralkyl groups such as benzyl, phenylethyl and phenylpropyl. Also included are halogen-substituted monovalent hydrocarbon groups wherein some or all of the hydrogen atoms in the foregoing hydrocarbon groups are replaced by halogen atoms such as chlorine, fluorine and bromine, for example, chloromethyl, bromoethyl and trifluoropropyl.

Among others, copolymers of the following structures are desirable.

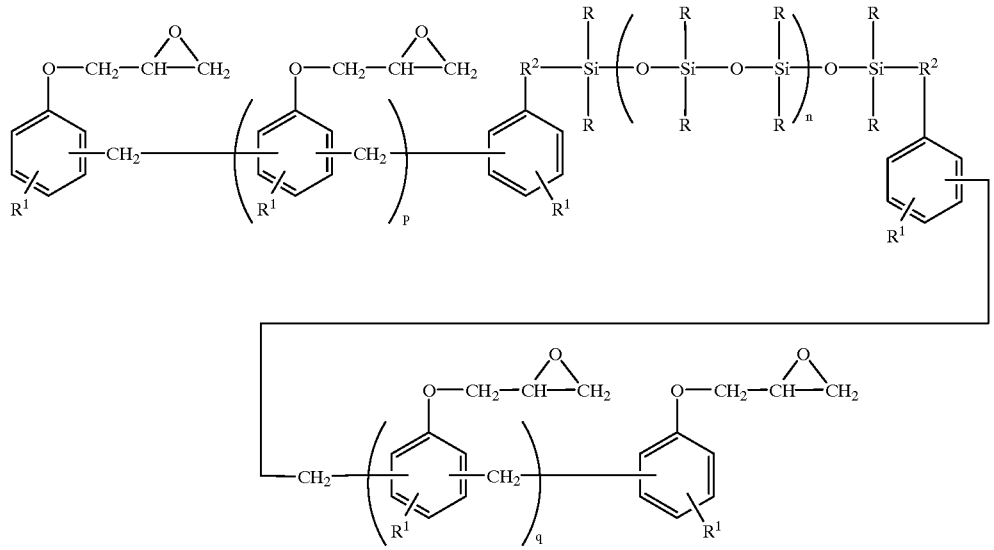

-continued

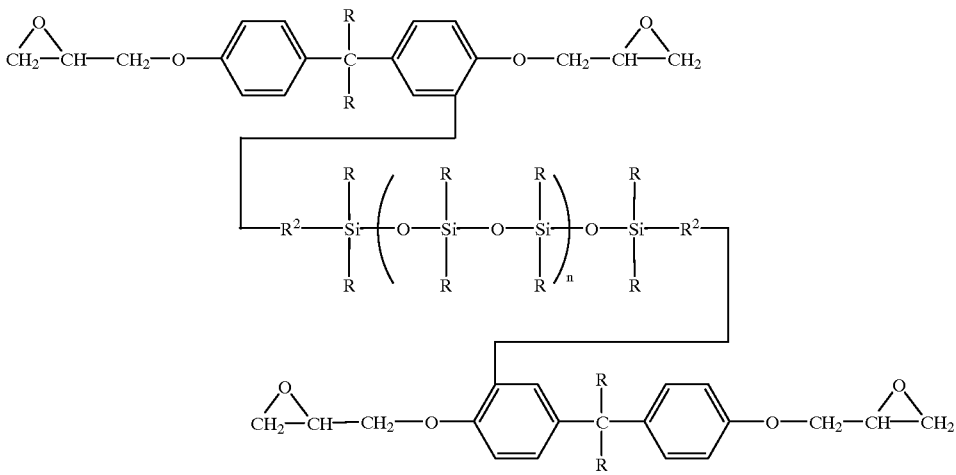

Herein, R is as defined above, $R^1$ is hydrogen or alkyl of 1 to 4 carbon atoms, $R^2$ is —$CH_2CH_2CH_2$—, —$OCH_2$—CH(OH)—$CH_2$—O—$CH_2CH_2CH_2$— or —O—$CH_2CH_2CH_2$—, letter n is an integer of 4 to 199, preferably 19 to 99, p is an integer of 1 to 10, and q is an integer of 1 to 10.

The copolymer is blended in such amounts that 0 to 20 parts, especially 2 to 15 parts by weight of the diorganopolysiloxane unit is available per 100 parts by weight of the epoxy resin. Then the stress can be further reduced.

In the sealing material in the form of a liquid epoxy resin composition according to the invention, various other additives are blended if necessary. Such additives include carbon-functional silanes for improving tackiness, pigments (e.g., carbon black), dyestuffs, antioxidants, and surface treating agents (e.g., γ-glycidoxypropyltrimethoxysilane). Additionally, well-known curing agents and curing accelerators can be blended insofar as the objects of the invention are not impaired. It is desirable to avoid the use of acid anhydride curing agents.

The epoxy resin composition according to the invention can be prepared, for example, by simultaneously or separately agitating, dissolving, mixing and dispersing the epoxy resin, inorganic filler and other optional ingredients as well as the curing accelerator while heating if desired. The device for mixing, agitating and dispersing the ingredients is not critical although an attritor, three-roll mill, ball mill or planetary mixer each equipped with agitating and heating means is generally used. A suitable combination of these devices is also useful.

With respect to the viscosity of the liquid epoxy resin composition used as the sealing material, it should preferably have a viscosity of less than about 10,000 poises at 25° C. A conventional method and conditions may be employed in molding or forming the sealing material. Preferably, a seal is formed by molding and curing the sealing material in a heating oven at 120° C. for at least ½ hour and then at 150° C. for at least ½ hour. Less than ½ hour of post-curing at 150° C. would fail to achieve satisfactory cured characteristics. Less than ½ hour of primary curing at 120° C. would allow voids to develop after curing.

Referring to FIG. 1, a flip-chip type semiconductor device according to one embodiment of the invention is illustrated as comprising an organic substrate 1 having a wiring pattern-bearing surface (upper surface in the figure). A semiconductor chip 3 is mounted on the wiring pattern-bearing surface via a plurality of bumps 2 to define gaps between the substrate 1 and the semiconductor chip 3 and also between the bumps 2. The gaps are filled with an underfill material 4 and sealed along sides thereof with a fillet material 5. The sealing material of the invention is advantageous especially in forming the underfill material.

When the sealing material of the invention is used as an underfill material, its cured product should preferably have a coefficient of thermal expansion (CTE) of 20 to 40 ppm/° C. at temperatures below its glass transition temperature (Tg). Any of well-known sealing materials may be used as the fillet material although a liquid epoxy resin composition similar to the above-mentioned one may also be used. When a liquid epoxy resin composition is used the fillet material, its cured product should preferably have a CTE of 10 to 20 ppm/° C. at temperatures below its Tg.

EXAMPLE

Examples of the invention are given below by way of illustration and not by way of limitation.

Examples 1–6 and Comparative Examples 1–4

Ten epoxy resin compositions were prepared by uniformly milling the components shown in Tables 1 and 2 in a three-roll mill. The following tests were carried out on these epoxy resin compositions. The results are also shown in Tables 1 and 2.

viscosity

Using a BH type rotating viscometer, a viscosity at 25° C. was measured at 20 rpm.

Thixotropy

Using a BH type rotating viscometer, a viscosity at 250° C. was measured at 2 rpm and 20 rpm. Thixotropy is the viscosity at 2 rpm divided by the viscosity at 20 rpm.

Gelling time

The time passed until the composition gelled on a hot plate at 120° C. or 150° C. was measured.

Glass transition temperature (Tg)

Using a thermomechanical analyzer (TMA), glass transition was observed while heating a cured sample of 5 mm×5 mm×15 mm at a rate of 5° C./min.

CTE-1: a coefficient of thermal expansion at temperatures below Tg.

CTE-2: a coefficient of thermal expansion at temperatures above Tg.

In the above measurement of Tg, CTE-1 was determined in the temperature range of 50 to 80° C. and CTE-2 was determined in the temperature range of 200 to 230° C.

Infiltration test

Figure 2A:
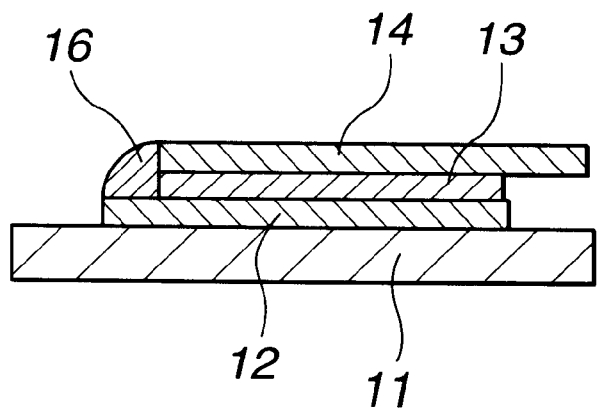
FIG. 2 illustrates a test piece used in an infiltration test, FIG. 2A being a side view and FIG. 2B being a plan view.
Figure 2B:
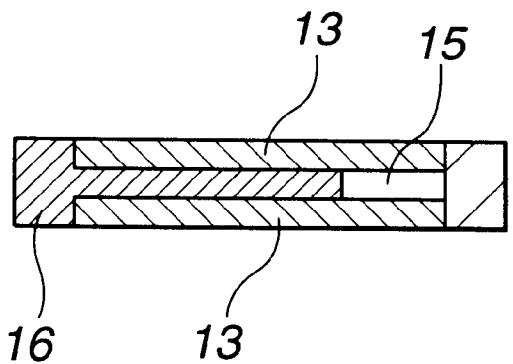

As shown in FIGS. 2A and 2B, a lower slide glass plate 12 was rested on a hot plate 11. A pair of 80-micron polyimide films 13 and 13 laterally spaced 1 cm from each other were set on the glass plate 12. An upper slide glass plate 14 was rested thereon. The slide glass plates 12, 14 defined with the two polyimide films 13, 13 an elongated space 15 having a width of 1 cm and a height of 80 μm. A mass of epoxy resin composition 16 was placed on the lower slide glass plate 12 at one end of the space 15. With this setting, the hot plate 11 was heated at 80° C. or 120° C. whereupon the epoxy resin composition 16 infiltrated through the space 15. The infiltration time was measured until the composition 16 infiltrated and reached a distance of 20 mm from the one end of the space 15.

PCT Separation Test

A polyimide-coated silicon chip of 10 mm×10 mm was rested on a FR-4 substrate of 30 mm×30 mm with a spacer of about 100 μm thick interposed therebetween. An epoxy resin composition for the underfill was forced to penetrate into the gap between the chip and the substrate and cured therein. The assembly was placed for 168 hours in a pressure cooker test (PCT) environment of 121° C. and 2.1 atm. Thereafter, whether the underfill separated from the chip and the substrate was observed by C-SAM.

Thermal Shock Test

A polyimide-coated silicon chip cut to 10 mm×10 mm and having a thickness of 0.6 mm was rested on a FR-4 substrate of 30 mm×30 mm with a spacer of about 100 μm thick interposed therebetween. An epoxy resin composition for the underfill was forced to penetrate into the gap between the chip and the substrate. Another epoxy resin composition for the fillet was applied to the sides of the chip. This assembly was heated at 150° C. for 4 hours for curing the epoxy resin compositions. The assembly was subjected to thermal cycling between −55° C. for 1 min and 160° C. for 30 sec. The assembly was observed after 100 cycles. Those samples whose cured portions cracked or separated were rejected. A percent rejection was calculated as a percentage of rejected samples per 20 samples.

| Epoxy resin composition as fillet | |
|---|---|
| Ingredients | Parts by weight |
| RE310 | 30 |
| RE304 | 17 |
| MH700 | 45 |
| SO32H | 250 |
| KBM403 | 1.0 |
| HX3741 | 2 |
| Compound containing diorganopolysiloxane units as shown below | 8 | the addition reaction product between the following two:

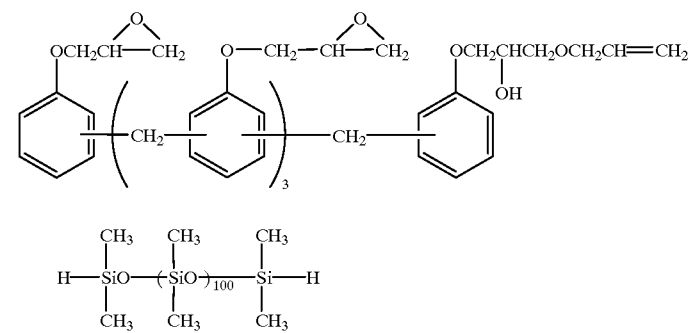

| Properties of fillet | |
|---|---|
| Viscosity (poise/25° C.) | 300 |
| Gelling time (sec/150° C.) | 74 |
| Tg (° C.) | 130 |
| CTE-1 (ppm/° C.) | 18 |
| CTE-2 (ppm/° C.) | 65 |

Storage Stablity Test

A polyethylene bottle containing a composition sample was sealed and kept for 96 hours in a thermostat chamber at 25° C.

TABLE 1

|  | EX1 | EX2 | EX3 | EX4 | EX5 | EX6 |
|---|---|---|---|---|---|---|
| Composition (parts by weight) | | | | | | |
| RE310 | 100 | — | 100 | 100 | 50 | — |
| RE304 | — | 100 | — | — | 50 | 100 |
| MH700 | — | — | — | — | — | — |
| SO32H | 150 | 150 | 150 | 150 | 150 | 150 |
| K8M403 | 1.0 | 1.0 | 1.0 | 1.0 | 1.0 | 1.0 |

TABLE 1-continued

|  | EX1 | EX2 | EX3 | EX4 | EX5 | EX6 |
|---|---|---|---|---|---|---|
| 2PHZ-PW | 5 | — | 3 | — | — | — |
| 2P4MHZ-PW | — | 5 | — | 3 | 3 | — |
| 2E4MZ | — | — | — | — | — | — |
| HX3741 | — | — | — | — | — | — |
| 2MZ-A-PW | — | — | — | — | — | 5 |
| Characteristics |  |  |  |  |  |  |
| Viscosity (poise/25° C.) | 380 | 250 | 320 | 330 | 290 | 340 |
| Thixotropy | 1.01 | 1.01 | 1.02 | 1.05 | 1.05 | 1.02 |
| Gelling time (min/120° C.) | 25 | 10 | 35 | — | — | — |
| Gelling time (sec/150° C.) | 400 | 90 | 500 | 120 | 100 | 90 |
| Tg (° C.) | 140 | 130 | 141 | 135 | 135 | 138 |
| CTE-1 (ppm/° C.) | 30 | 32 | 31 | 32 | 28 | 30 |
| CTE-2 (ppm/° C.) | 100 | 105 | 104 | 100 | 98 | 99 |
| Infiltration time (sec/80° C.) | 300 | 260 | 280 | 290 | 270 | 290 |
| Infiltration time (sec/120° C.) | 80 | 80 | 80 | 90 | 80 | 90 |
| PCT separation test | no separation | no separation | no separation | no separation | no separation | no separation |
| Reject (%) in thermal shock test | 0 | 0 | 10 | 0 | 0 | 0 |
| Storage stability test | 3% thickened | 3% thickened | 5% thickened | 5% thickened | 5% thickened | 5% thickened |

TABLE 2

|  | CE1 | CE2 | CE3 | CE4 |
|---|---|---|---|---|
| Composition (parts by weight) |  |  |  |  |
| RE310 | 50 | 100 | 100 | 100 |
| RE304 | — | — | — | — |
| MH700 | 40 | — | — | — |
| SO32H | 150 | 150 | 150 | 150 |
| KBM403 | 1.0 | 1.0 | 1.0 | 1.0 |
| 2PHZ-PW | — | — | 0.5 | — |
| 2P4MHZ-PW | — | — | — | 20 |
| 2E4MZ | — | 5 | — | — |
| HX3741 | 5 | — | — | — |
| 2MZ-A-PW | — | — | — | — |
| Characteristics |  |  |  |  |
| Viscosity (poise/25° C.) | 150 | 300 | 360 | 460 |
| Thixotropy | 1.02 | 1.03 | 1.03 | 1.10 |
| Gelling time (min/120° C.) | — | — | — | — |
| Gelling time (sec/150° C.) | 50 | 30 | 700 | 45 |
| Tg (° C.) | 150 | 142 | 112 | 135 |
| CTE-1 (ppm/° C.) | 28 | 30 | 30 | 32 |
| CTE-2 (ppm/° C.) | 110 | 100 | 100 | 110 |
| Infiltration time (sec/80° C.) | 90 | 320 | 200 | short of 20 mm |
| Infiltration time (sec/120° C.) | short of 20 mm | short of 20 mm | 40 | short of 20 mm |
| PCT separation test | separated | no separation | separated | separated |
| Reject (%) in thermal shock test | 50 | 30 | 30 | 40 |
| Storage stability test | 50% thickened | 40% thickened | 1% thickened | 60% thickened |

Note:
RE310: bisphenol A type epoxy resin by Nippon Kayaku K.K.
RE304: bisphenol F type epoxy resin by Nippon Kayaku K.K.
MH700: methyltetrahydrophthalic anhydride by Shin-Nippon Rika K.K.
SO32H: spherical silica having a maximum particle diameter of 45 μm and a mean particle diameter of 2 μm by Admatechs K.K.
KBM403: γ-glycidoxypropyltrimethoxysilane by Shin-Etsu Chemical Co., Ltd.
2PHZ-PW: 2-phenyl-4,5-dihydroxymethylimidazole powder having a mean particle diameter of 4.2 μm and a maximum particle diameter of 15 μm by Shikoku Chemicals K.K.
2P4MHZ-PW: 2-phenyl-4-methyl-5-hydroxymethylimidazole powder having a mean particle diameter of 3.8 μm and a maximum particle diameter of 15 μm by Shikoku Chemicals K.K.
2E4MZ: 2-ethyl-4-methylimidazole (liquid at room temperature) by Shikoku Chemicals K.K.
HX3741: microcapsulated catalyst containing an imidazole compound by Asahi-Ciba K.K.
2MZ-A-PW: 2,4-diamino-6-[2'-ethyl-4'-methylimidazolyl-(1)']-ethyl-S-triazine having a mean particle diameter of 4.0 μm and a maximum particle diameter of 15 μm by Shikoku Chemicals K.K.

There has been described a flip-chip type semiconductor device sealing material having an improved thin-film infiltration capability and storage stability. The flip-chip type semiconductor device sealed therewith remains highly reliable.

Japanese Patent Application No. 11-033730 is incorporated herein by reference.

Although some preferred embodiments have been described, many modifications and variations may be made

What is claimed is:

1. A sealing material for flip-chip type semiconductor devices in the form of a liquid epoxy resin composition comprising (A) a liquid epoxy resin, (B) an inorganic filler, and (C) a curing accelerator having a solubility of up to 1% by weight in the epoxy resin, a melting point of at least 170° C., a mean particle diameter of 1 to 5 μm, and a maximum particle diameter of up to 20 μm, and represented by the following general formula (1):

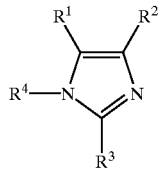

(1)

wherein $R^1$ and $R^2$ each are hydrogen, methyl, ethyl, hydroxymethyl or phenyl, $R^3$ is methyl, ethyl, phenyl or allyl, and $R^4$ is hydrogen or a group of the following formula (2):

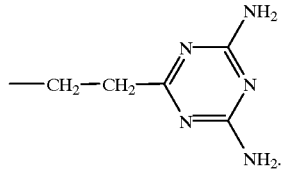

(2)

2. The sealing material of claim 1 wherein said curing accelerator is 2-phenyl-4-methyl-5-hydroxymethylimidazole, 2-phenyl-4,5-dihydroxymethylimidazole or 2,4-diamino-6-[2'-ethyl-4'-methylimidazolyl-(1)']-ethyl-S-triazine.

3. A flip-chip type semiconductor device sealed with the sealing material of claim 1 or 2.

* * * * *